(12) United States Patent
Oguz et al.

(10) Patent No.: US 7,882,421 B2
(45) Date of Patent: Feb. 1, 2011

(54) METHOD AND APPARATUS FOR JOINT SOURCE-CHANNEL MAP DECODING

(76) Inventors: Seyfullah Halit Oguz, 5240 Fiore Ter., Apartment 417, San Diego, CA (US) 92122; Vijayalakshumi R. Raveendran, 4272 Calle Mar De Ballenas, San Diego, CA (US) 92130

( * ) Notice: Subject to any disclaimer, the term of this patent is extended or adjusted under 35 U.S.C. 154(b) by 890 days.

(21) Appl. No.: 11/120,391

(22) Filed: May 2, 2005

(65) Prior Publication Data

US 2005/0275573 A1 Dec. 15, 2005

Related U.S. Application Data

(60) Provisional application No. 60/569,400, filed on May 6, 2004.

(51) Int. Cl.
*H03M 13/00* (2006.01)
(52) U.S. Cl. .................. 714/776; 714/779; 714/801
(58) Field of Classification Search ............. 714/776, 714/779, 799, 801, 746, 764, 788; 375/144, 375/240.27
See application file for complete search history.

(56) References Cited

U.S. PATENT DOCUMENTS

| 6,463,185 B1 * | 10/2002 | Mori et al. .................. 382/302 |
| 6,530,055 B1 * | 3/2003 | Fukunaga .................... 714/746 |
| 6,944,206 B1 * | 9/2005 | Dent ........................ 375/144 |
| 2003/0012287 A1 * | 1/2003 | Katsavounidis et al. 375/240.27 |

FOREIGN PATENT DOCUMENTS

| CL | 01045-2005 | 12/2005 |
| JP | 2004528752 | 9/2004 |
| WO | 99021090 | 4/1999 |
| WO | WO02043315 | 5/2002 |

OTHER PUBLICATIONS

International Search Report, PCT/US05/015817, International Search Authority, European Patent Office, Dec. 29, 2005.
Written Opinion, PCT/US05/015817, International Search Authority, European Patent Office, Dec. 29, 2005.
Aign, "Error concealment enhancement by using the reliability outputs of a SOVA in MPEG-2 video decoder," Signals, Systems, and Electronics, International Symposium on San Francisco, XP010159178 (1995).
Asbun et al., "Real-time error concealment in digital video streams using digital signal processors," IEEE Transactions on consumer electronics, XP001200521 (2001).
Lee et al., "An integrated application of multiple descipriong transform coding and error concealment for error-resilient video streaming," Signal Processing, Image Communication, XP004472767 (2003).

(Continued)

*Primary Examiner*—Fritz Alphonse
(74) *Attorney, Agent, or Firm*—Milan I. Patel; Gerald P. Joyce, III (57) ABSTRACT

A method for error correction that includes receiving a bitstream, the bitstream comprising one or more bits, determining if the bitstream has one or more corrupt bits, determining one or more hypotheses representing an error pattern, and assigning a probability to each of the hypotheses, wherein the probability is determined based on one or more reference data.

31 Claims, 6 Drawing Sheets

OTHER PUBLICATIONS

Salama et al., "A Bayesian approach to error concealment in encoded video streams," Processing of the International Conference on Image Processing, XP010202591 (1996).

ITU-T H.264 Standard: Series H, Audiovisual and Multimedia Systems, Infrastructure of Audiovisual Services - Coding of Moving Video (Mar. 2005).

* cited by examiner

METHOD AND APPARATUS FOR JOINT SOURCE-CHANNEL MAP DECODING

CLAIM OF PRIORITY UNDER 35 U.S.C. §119

The present Application for Patent claims priority to Provisional Application No. 60/569,400 entitled "Method and Apparatus for Joint Source-Channel MAP VLC" filed May 6, 2004, and assigned to the assignee hereof and hereby expressly incorporated by reference herein.

BACKGROUND

1. Field

The invention relates to digital communications and, more particularly, to channel and source decoding.

2. Background

The demands of higher data rates and higher quality of service in mobile communication systems is growing rapidly. However, factors such as limited transmit power, limited bandwidth and multi-path fading continue to restrict the data rates handled by practical systems. In multimedia communications, particularly in error-prone environments, error resilience of the transmitted media is critical in providing the desired quality of service because errors in even a single decoded value can lead to decoding artifacts propagating spatially and temporally. Various encoding measures have been used to minimize errors while maintaining a necessary data rate, however all of these techniques suffer from problems with errors arriving at the decoder side.

Through the use of a source encoder, data is compressed—conveying the maximum information by expending the minimum number of bits, followed by a channel encoder that tends to maximize the capacity of the transmission channel for a given probability of error in receiving these bits.

Channel coding, for example, Reed-Solomon coding, is used to improve the robustness of the source coded data. Joint source-channel coding methodologies have been used to provide unequal error protection to source coded data with unequal importance or to enable rate adaptation of coded video data to available network bandwidth through partitioning and dropping packets. This is because the common transport protocols do not deliver corrupted data to the source decoder.

Source coding techniques such as reversible variable length coding (e.g. in MPEG-4) have been used for error recovery by decoding the packet in the reverse order when corrupt packets are in fact received. There is a compromise in coding efficiency with source coding techniques, which translates to quality of decoded video for a given bit rate.

Entropy coding enables very efficient lossless representations of symbols generated by random information sources. As such it is an indispensable component of both lossless and lossy data compression schemes. Despite its tremendous benefits to compression efficiency, entropy coding also complicates the decoding process. A common feature of all different approaches to entropy coding is that a single or a sequence of source symbols (dictionary coding) is associated and represented with a binary pattern i.e. a sequence of ones and zeros known as a codeword, the length of which increases with decreasing symbol likelihood. Hence more likely symbols are assigned more compact representations, enabling on average a substantial savings over a straightforward symbol alphabet size based fixed-length representation.

The ambiguity around how many bits to consume for the next symbol in a bitstream, i.e. in an entropy coded representation of the output of an information source, is an obvious complication for a decoder. However, much more importantly, in case of errors in the bitstream, the use of variable size codewords in conjunction with flipped bits (due to errors) will frequently result in the emulation of an incorrect codeword length and as a result the parsing/decoding process will loose its synchronization with the bitstream, i.e., correct identification of codeword boundaries and hence correct interpretation of the bitstream will start failing.

Assume a decoder implementing a basic level of error detection measures encounters a problem in decoding a bitstream and loses syncronization. Eventually, due to either a syntax violation, i.e., an invalid codeword, or a semantic failure e.g. invalid parameter values or unexpected bitstream object, the decoder will become aware of the problem and take necessary steps to resynchronize itself with the bitstream. This will typically induce data loss to an extent much beyond the corruption that triggered the data loss in the first place. One reason for this is the fact that points in the bitstream that enable resynchronization, with slice boundaries being the most common example, cannot be frequently utilized due to the overhead of providing them. A more important reason is their toll on compression efficiency stemming from the requirement that, across these points, all forms of encoding/decoding dependencies are to be avoided, e.g. predictive coding chains to be terminated and restarted after a default initialization.

Another reason that will cause data loss in excess of the initial corruption is due to incorrect codeword emulation. The identification of the initial bit error position is not a trivial task and typically is not possible without a special design below the application layer i.e. a channel decoder supporting this. Hence, upon detecting bitstream corruption, the source decoder will have to stop decoding and move forward in the bitstream to find the next resynchronization point, and in the process necessarily skipping a sizeable amount of potentially healthy data. Although emulation of a different codeword, which is the same length as the original, i.e. authentic, codeword might seem to be less of a problem with respect to the sequence of events described above, this is actually not the case. There are many ways in which this kind of an error may lead to failures in a decoder's correct bitstream interpretation. For example, in most current codecs there are objects in the bitstream (compression related parameters) whose values influence the syntax of the following portion of the bitstream. Hence, an incorrect value for such an object will lead to an incorrect bitstream interpretation.

After the introduction of the video compression standard H.264, there is yet another reason which makes emulation of incorrect-but-same-length codewords as bad as synchronization loss. The so called context adaptivity (or context dependency) of entropy coding rules may result in a situation where bitstream synchronization is lost not due to the emulation of a different-size codeword i.e. codeword size stays the same, but rather the incorrect value (decoded from the incorrect codeword) triggers an unauthentic context change thereby replacing entropy decoding rules in effect with an alternate and incorrect set of rules. In all cases described, even a single incorrectly decoded value will lead to decoding artifacts.

An improved method to correct the bit errors is needed to avoid the data loss associated with a source decoder's synchronization loss and the resulting resynchronization in entropy coded bitstreams. That is, the residual bit errors, i.e., bit errors that were either not detected or detected and not corrected by the forward error correction scheme employed, and their degrading impact on the decoding of entropy coded bitstreams, need to be addressed.

SUMMARY

A method and apparatus for digital communication is described that offers improved error correcting capabilities at a decoder, such as at a mobile device. Noisy data received at the mobile device is demodulated and sent to a decoder in the physical layer, such as a concatenated decoder. After decoding, both correctly received symbols and incorrectly received symbols (containing one or more corrupt bits) are transferred to the application layer where a software application or application specific hardware, for example, performs an optimization problem formulation within the Maximum a Posteriori Probability (MAP) framework and solves it to determine likelihoods for hypotheses about entropy coded symbols, the representations of which are corrupt with erroneous bits.

Correlating information in correctly decoded symbols is maintained in one of one or more memory modules associated with the MAP application. Channel data from the concatenated channel decoder is monitored and used to generate probability distribution functions describing and relative to various channel conditions. One or more of these PDFs are available to the MAP application depending on the current (actual or estimated) channel condition. Information about suspect corrupt bits in incorrectly received symbols is stored in a memory module along with their position information. Information from correctly decoded symbols that may correlate to the incorrectly received symbols is maintained. The correlating information is used to generate a refined a posteriori probability distribution. Determining a MAP formulation for an incorrectly received symbol is accomplished by using the appropriately refined a priori PDF for that symbol along with the conditional PDF of the relevant channel observation conditioned on the hypothesis about the incorrectly received symbol. The result is the MAP functional that is then maximized to determine the correct value of the incorrectly received symbol.

DETAILED DESCRIPTION

In the following description, specific details are given to provide a thorough understanding of the embodiments described. However, it will be understood by one of ordinary skill in the art that the embodiments may be practiced without these specific details. For example, electrical components may be shown in block diagrams in order not to obscure the embodiments in unnecessary detail. In other instances, such components, other structures and techniques may be shown in detail to further explain the embodiments.

It is also noted that the embodiments may be described as a process, which is depicted as a flowchart, a flow diagram, a structure diagram, or a block diagram. Although a flowchart may describe the operations as a sequential process, many of the operations can be performed in parallel or concurrently and the process can be repeated. In addition, the order of the operations may be re-arranged. A process is terminated when its operations are completed. A process may correspond to a method, a function, a procedure, a subroutine, a subprogram, etc.

Within a digital communication system for compressed data transmission, an error recovery method and apparatus is described that exploits error-free received information to recover corrupted parts of the received data. Corrupt data in incorrectly received symbols is estimated by statistically evaluating received symbols having reference data correlating to the corrupt data. In one example, a Maximum A Posteriori Probability (MAP) optimization formulation is performed for handling packets incorrectly received at the application layer. To estimate the values of symbols inside these incorrectly received packets, calculating the MAP functional uses information from received symbols related to reference data that correlates to symbols corrupt with erroneous bits in the incorrectly received packets.

In one embodiment, the MAP framework makes use of statistical analysis of reference data obtained from monitoring incoming channel data. In one example, the method and apparatus is applied as an extension to the existing Joint Video Team (JVT) H.264 video coding standard, however, the basic concept can be extended to other compressed video, audio, image and generic multimedia communications applications where coded video and/or audio or other forms of information, is transmitted over channels that introduce different error characteristics to data pertaining to different segments of the data or to correlating segments of it.

Figure 1:
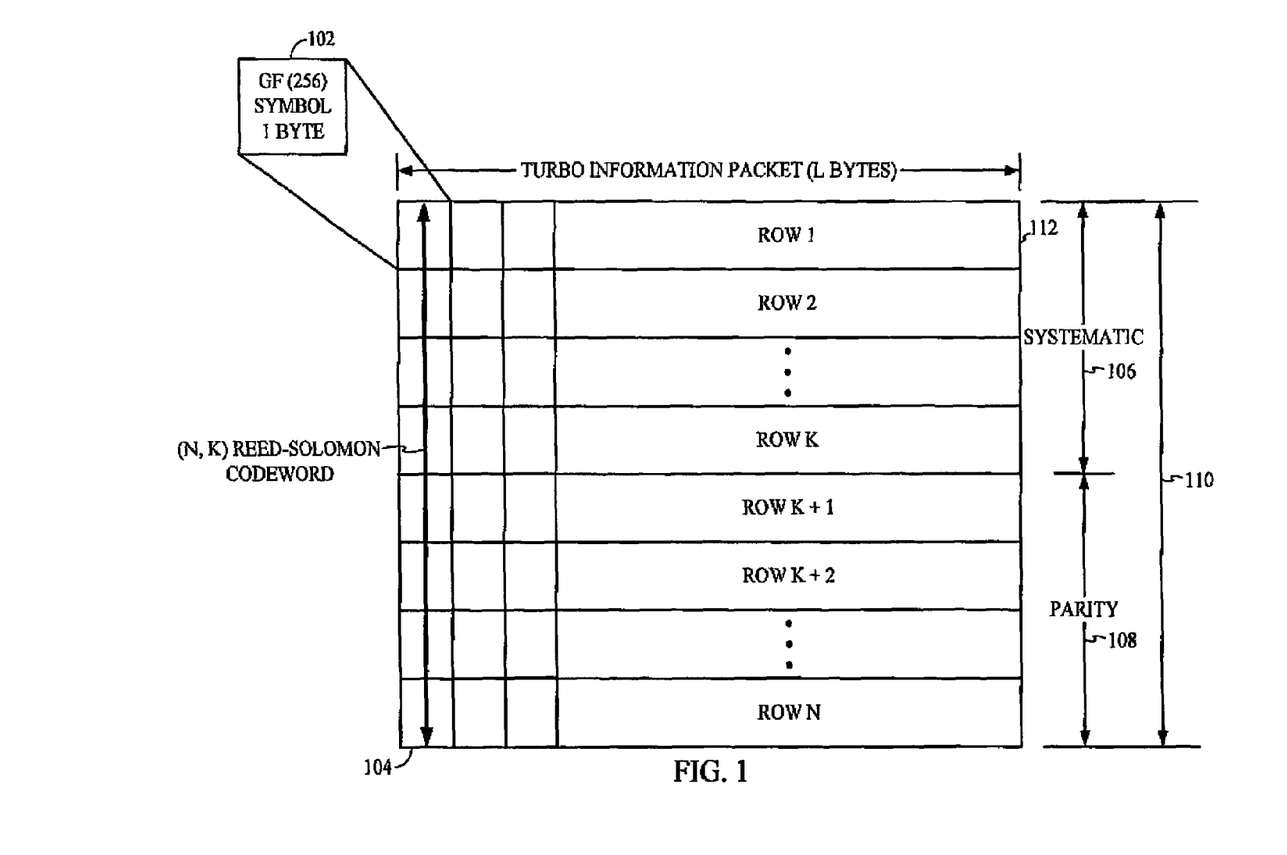
FIG. 1 is one example of symbols output from a source coder and formatted into a code block for Reed Solomon erasure coding followed by Turbo coding.

FIG. 1 is one example of symbols output from an H.264 encoder and organized for concatenated Reed Solomon erasure and Turbo coding. With respect to this encoding side, symbols output from the information source e.g. binary codewords output from the H.264 encoder, are blocked into bytes 102. Each byte 102 is considered a symbol in a finite field known as a "Galois Field (256)" for the purposes of an outer (N, K) Reed-Solomon (RS) code over GF(256). N and K respectively denote the sizes of the entire RS codeword 104 and its source data 106 holding systematic portion in number of symbols, thus (N-K) giving the number of parity symbols 108 added to each codeword 104. An (N, K) RS code is capable of correcting (N-K) erasures.

The top K rows 106 essentially hold the symbols output from the information source and these symbols can be scanned into the K rows in either rows-first or columns-first manner. The interleaving achieved by the columns-first scan, results in significantly shorter burst lengths. Therefore, column-wise symbol placement is more desirable for use in conjunction with this example. After this initial step of source data placement, each of the L columns 104 (of K bytes) is RS coded into N bytes, by adding N-K parity bytes, and hence, rows K+1, . . . , N 108 in FIG. 1 are generated. The top K rows, consisting of source data 106, are referred to as the RS information block, and the entire set of N rows as the RS encoded block, or simply the code block 110.

Each row 112 is appended a CRC (Cyclic Redundancy Check) checksum and some trailing bits required for the correct operation of a turbo coder. By appending a checksum to each row 112, those rows failing to satisfy their respective checksums after turbo decoding will be declared erased. Each code block 110 is input one row 112 at a time to a turbo coder, and, hence, each row is referred to as a Turbo information packet. Turbo coder's output bits are modulated and input to the channel.

Reed-Solomon coding uses algorithms that rely on special properties of Galois Field (GF) operations. A set of real numbers can be designated as a field and where the field has a finite number of elements, such finite fields are also called Galois Fields. If p is a prime number and q is any power of p, there are codes with symbols from a Galois field GF (q). Reed-Solomon codes with code symbols from the Galois field GF ($2^m$), i.e. p=2, and q=$2^m$, are considered frequently for practical digital communication systems and the generator polynomial of this code is specified in terms of its roots from the Galois field GF ($2^m$).

Figure 2:
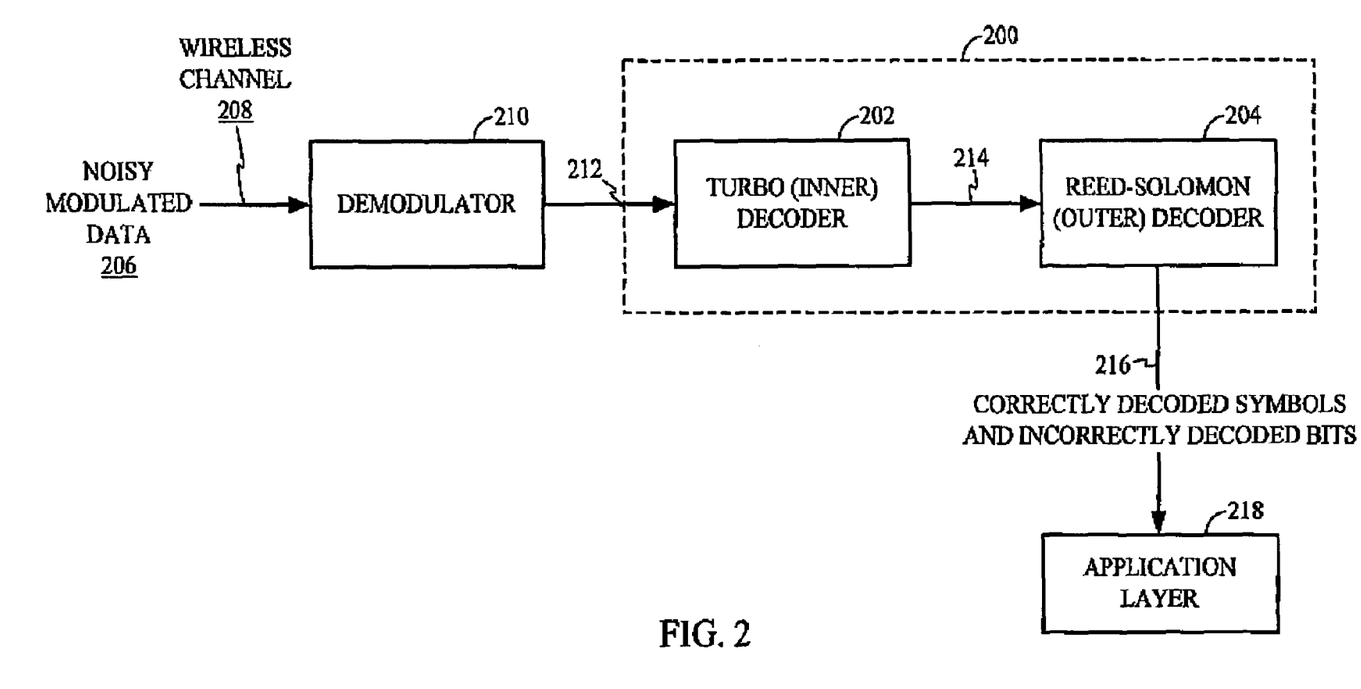
FIG. 2 is one example of a concatenated Turbo/Reed-Solomon decoding scheme.

FIG. 2 is one example of a Turbo/Reed-Solomon concatenated decoding scheme. The error correction scheme adopted uses a concatenated code 200, i.e., both an inner (channel) code 202 and an outer (channel) code 204. The concatenated channel decoder 200 consists of a Turbo (inner) decoder 202 performing in the physical layer and a Reed-Solomon (outer) erasure correcting decoder 204 positioned in the transport/MAC layer. With such a concatenated system 200, noisy modulated data 206 is received across a digital communication system 208. The data 206 is received at a demodulator 210 with the demodulated data 212 passed to the turbo decoder 202 to provide some error control. The turbo decoder 202 then presents hard-decision data 214 to the outer Reed-Solomon decoder 204, which further reduces the rate of residual errors. Depending on the total number of erasures within a code block and the number (N-K) of parity symbols per RS codeword used, erasure correction will succeed or fail. The correctly received, the incorrectly received but corrected, and the remaining incorrectly received and could-not-be-corrected data 216 are then passed to the application layer 218.

In the channel coding design targeted for the physical layer, if the Reed-Solomon (RS) Code Block has erasures beyond the correction capacity, the corresponding RS Information Block (FIG. 1) will invariably be passed to the application layer 218, i.e., source decoder, with a joint notification stating which of the K Turbo Information Packets 112 (FIG. 1) are corrupt. The systematic structure of the outer (N, K) RS Code over GF (256) enables the straightforward utilization of turbo information packets, which are not corrupt i.e. correctly received.

When the erasure decoding fails for a code block, i.e., total number of erasures>(N-K), the Reed-Solomon decoding layer still passes the information block to the application layer 218 such as the video decoding layer, along with information regarding erasure locations or some equivalent information such as potentially corrupt byte positions.

A typical video signal is well known to be a non-stationary random signal, such as one with varying spatiotemporal statistical properties. Nevertheless since the variation is most of the time neither extremely fast nor without structure, significant local/temporary correlations exist both spatially and temporally that enable the large compression ratios achieved by contemporary video compression standards/algorithms.

Both the pixel values of the raw digital video signal and the transformed/processed quantities and objects generated by video compression algorithms from the raw pixel values, are random variables/vectors. As such, over the range of video signals under consideration, these random variables/vectors have "a priori" probability distributions and other higher order statistics, which characterize them in the absence of any additional information.

These spatiotemporal correlations govern many of the intermediate as well as final quantities and objects (symbols), which go into the bitstream i.e. into the compressed representation of a raw digital video source. This implies that the availability of some accurate/reliable information on any one of these symbols enables reducing the ambiguity about certain other symbols through its correlations with them. A very convenient mathematical model to account for this observation is through the use of a posteriori probability distributions. The a posteriori probability distributions reflect the changes in the probabilistic description of these random symbols induced by the indirect information attained through correlated observations.

In one example, a Context Adaptive Variable Length Code (CAVLC) coded syntax element is used in H.264. A context represents a classification of the decoding state based on already received reliable information. Therefore, a context actually corresponds to a particular a posteriori distribution of the symbol under consideration. In H.264, many symbols are encoded in a context, and the probability of each symbol varies with respect to the context in which it is coded, that is, what has been processed before a symbol. Many video compression standards, including H.264, implicitly or explicitly define and utilize several contexts, for instance, the encoding type, I, P or B (where I, P and B are, respectively, Intra, Predicted and Bi-directional), chosen for a frame, sets a context which makes certain macroblock types more likely to be generated while coding that frame, necessitating more efficient representations for those more likely macroblock types. All contexts introduce probabilities that collectively describe a state and/or a regime into which the encoding/decoding process enters. These probabilities are determined after performing many tests on different test signals such as video sequences, using different quality settings. As the signal is being encoded or decoded, these contexts change and adapt to the actual input values.

A CAVLC coded symbol named coeff_token is used for illustrative purposes where coeff_token is an alias to a vector quantity with two components. These are:

1. TotalCoeff$\in$\{0, 1, 2, . . . , 16\}: the total number of non-zero transform coefficient levels in a 4×4 transformed and quantized block; and
2. TrailingOnes$\in$\{0, 1, 2, 3\}: the number of trailing '|value|=1' transform coefficient levels in the same 4×4 block.

Parsing and decoding coeff_token reveals values for these two quantities. Encoding and decoding processes with Variable Length Codes (VLC) will refer to a VLC code table. This code table has two entries, one is original data, i.e., a possible symbol value, and the other is the corresponding codeword. In one form of entropy coding, called variable length coding or Huffmann coding, the more likely values are associated to/with shorter codewords, while less likely values are associated to/with longer codewords. Consequently, knowing the statistics of the event/symbol to code, provided that such statistics are representative enough, it is possible to code such event/symbol with an average number of bits lower/less than that required by fixed length coding. Table 1 reflects a partial table specifying five possible different contexts (each corresponding to one of the last five columns of the table) for decoding coeff_token, which is defined as a function of a variable named nC, as well as the five associated context dependent VLC codebooks (each tuned to a corresponding different a posteriori distribution for the vector (TotalCoeff, TrailingOnes)).

TABLE 1

| TrailingOnes (coeff_token) | TotalCoeff (coeff_token) | $0 \leq nC < 2$ | $2 \leq nC < 4$ | $4 \leq nC < 8$ | $8 \leq nC$ | $nC == -1$ |
|---|---|---|---|---|---|---|
| 0 | 0 | 1 | 11 | 1111 | 00011 | 01 |
| 0 | 1 | 000101 | 001011 | 001111 | 000000 | 000111 |
| 1 | 1 | 01 | 10 | 1110 | 00001 | 1 |
| 0 | 2 | 00000111 | 000111 | 001011 | 000100 | 000100 |
| 1 | 2 | 000100 | 00111 | 01111 | 000101 | 000110 |
| 2 | 2 | 001 | 011 | 1101 | 000110 | 001 |
| 0 | 3 | 000000111 | 0000111 | 001000 | 001000 | 000011 |
| 1 | 3 | 00000110 | 001010 | 01100 | 001001 | 0000011 |
| 2 | 3 | 0000101 | 001001 | 01110 | 001010 | 0000010 |
| 3 | 3 | 00011 | 0101 | 1100 | 001011 | 000101 |
| 0 | 4 | 0000000111 | 00000111 | 0001111 | 001100 | 000010 |
| 1 | 4 | 000000110 | 000110 | 01010 | 001101 | 00000011 |
| 2 | 4 | 00000101 | 000101 | 01011 | 001110 | 00000010 |
| 3 | 4 | 000011 | 0100 | 1011 | 001111 | 0000000 |
| 0 | 5 | 00000000111 | 00000100 | 0001011 | 010000 | — |
| 1 | 5 | 0000000110 | 0000110 | 01000 | 010001 | — |
| 2 | 5 | 000000101 | 0000101 | 01001 | 010010 | — |
| 3 | 5 | 0000100 | 00110 | 1010 | 010011 | — |
| 0 | 6 | 0000000001111 | 000000111 | 0001001 | 010100 | — |
| 1 | 6 | 00000000110 | 00000110 | 001110 | 010101 | — |
| 2 | 6 | 0000000101 | 00000101 | 001101 | 010110 | — |
| 3 | 6 | 00000100 | 001000 | 1001 | 010111 | — |

Figure 3:
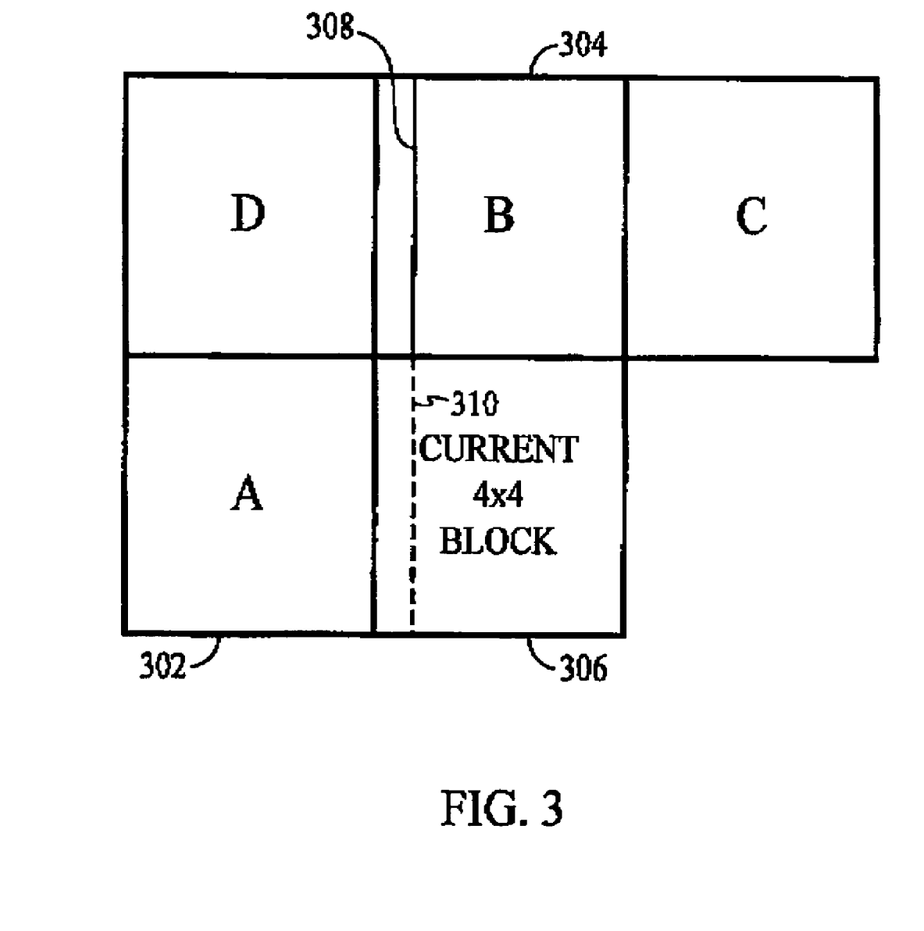
FIG. 3 is one example of an illustration of neighboring 4×4 blocks providing correlating data for a corrupt block.

FIG. 3 is an illustration of one example of neighboring 4×4 blocks providing correlating reference data for a corrupt current 4×4 block. With some simplifying generalization, the context determining variable nC is specified as a function of information available from the A (302) and B (304) neighboring 4×4 blocks. Correlating information from neighbors A (302) and B (304) help determine the context for decoding coeff_token in the current 4×4 block 306 for which the corresponding binary representation, i.e., codeword in the bitstream, is corrupt or partially corrupt.

Let nA and nB respectively be the number of non-zero transform coefficient levels (given by TotalCoeff(coeff_token )) in block A (302) located to the left of the current 4×4 block 306 and block B (304) located above the current 4×4 block 306. When blocks A (302) and B (304) are both available, nC can be given by the formula:

$$nC = (nA + nB + 1) >> 1. \quad [1]$$

This formula simply describes nC as the arithmetic mean of nA and nB where a fractional part of 0.5 in the result is always rounded up. This is one way in which reliable correlated information available from the neighboring 4×4 blocks A and B, changes the decoder's expectations on information pertaining to the current 4×4 block. Here this happens through the selection of a context (influencing bitstream interpretation and parsing) based on the value of nC which somehow summarizes the available a posteriori information. As can be easily judged from the different lengths of codewords representing the same coeff_token value in different contexts, the context modifies the a priori probability distribution of coeff_token in accordance with a posteriori information. It is one attribute of this embodiment that such a posteriori refined symbol probability distributions are used as the a priori symbol probability functions of the general MAP framework.

There are other less trivial ways in which already received reliable reference data, i.e., a posteriori information, can be utilized to refine symbol probability distributions. Assume that nA=4, nB=1, the 4×4 neighboring block B (304) is not vertically neighboring a slice boundary and it is inferred to contain a vertical directional structure, e.g., an image detail such as a vertical edge 308, say based on its intra 4×4 prediction mode. An application of the above formula [1] yields nC=3, implying a context different than either of neighbors A (302) and B (304). Under these circumstances, it is concluded that certainly a codeword from the VLC codebook belonging to the context '$2 \leq nC < 4$' was used to encode coeff_token for the current block 306.

In another example, due to the statistically very frequent and hence highly consistent presence of a vertical edge 308 within block B (304), a similar vertical edge 310 could be strongly expected to propagate from block B (304) into the current 4×4 block 306. Accordingly, the coefficient structure of the current 4×4 block 306 and that of neighboring 4×4 block B (304) are expected to be very similar to each other. Therefore, for the current 4×4 block, the coeff_token's a posteriori refined probability distribution should be closer to that associated with the context of neighboring Block B (304). Therefore in this case for the current block 306, although the codeword representing coeff_token will come from the context '$2 \leq nC < 4$' (as concluded by applying formula [1] above), the a posteriori refined probability distribution of it will be more accurately represented by that of context '$0 \leq nC < 2$'.

As described, there are significant differences between the following two probability distributions for coeff_token: (1) an a priori PDF in its true sense i.e., a PDF with no context or any other additional information available, and (2) an a posteriori refined PDF, in a sense a conditional PDF, given that the neighboring 4×4 Blocks A (302) and B (304) have total non-zero coefficient level counts nA and nB respectively.

In one example, a statistical approach incorporates a Bayesian framework to determine the Maximum A Posteriori Probability (MAP) formulation for parameter, i.e., symbol value, estimation. This Bayesian framework requires the use of an a priori probability model for the parameter to be estimated as well as a conditional probability model for the related observation given the parameter to be estimated. When the application layer (in the source decoder) 218 (FIG. 2 above) is about to parse and entropy decode the symbol 'coeff_token', the related observations and pieces of information about coeff_token that it has access to at that point can be categorized into two main classes as follows:

1. already received and successfully decoded healthy, i.e., reliable, correlated information, in particular those about the neighbors;

2. the potentially corrupt bitstream segment (with suspect bits) carrying the codeword representing the value of coeff_token.

Class 1 information above is very significant and in one example of the disclosed methods, Class 1 type of a posteriori information is incorporated into the Bayesian formulation through substituting the genuine a priori PDF of coeff_token by the appropriate context dependent (a posteriori refined) PDF. The Bayesian model described enables the use of all available information from the source (Class 1 above), and from the channel (Class 2 above in conjunction with a probabilistic channel model), and hence the name Joint Source-Channel entropy decoding.

Figure 4:
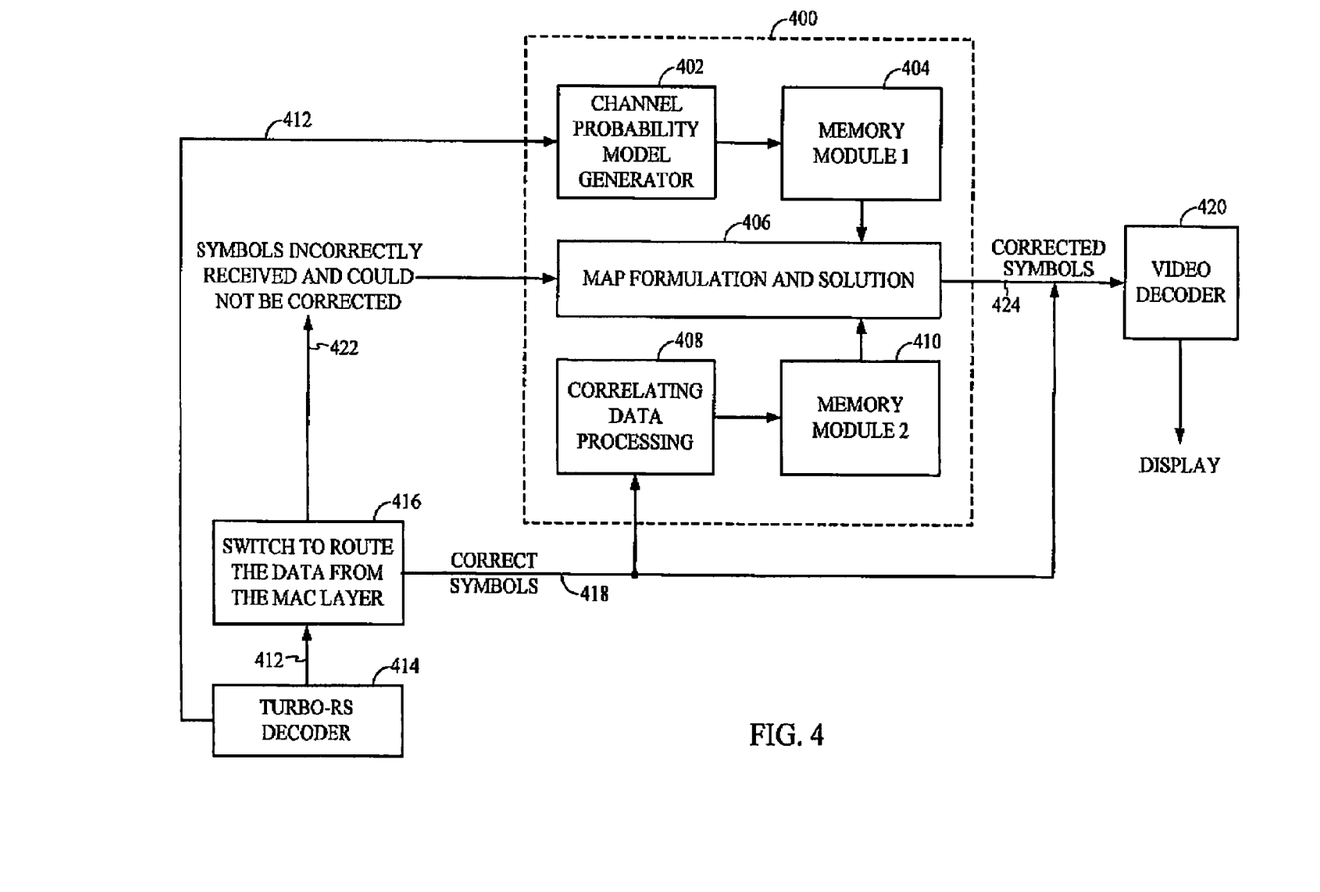
FIG. 4 is one example of a block diagram of a joint source-channel MAP entropy decoder.

FIG. 4 is a block diagram of a joint source-channel MAP decoder for entropy decoding. The joint source-channel entropy decoder 400 at the application layer includes a channel probability model generator component 402, a memory module 1 404, a MAP formulation and solution component 406, a correlating data processing component 408, and a memory 2 module 410. In one embodiment, the MAP formulation and solution component 402 can be realized through application software running on a general purpose or an embedded CPU. All data 412 from a concatenated Turbo/Reed-Solomon decoder 414, that is, correctly received (including incorrectly received but subsequently corrected) and incorrectly received symbols (erasures), is sent to the channel probability model generator component 402 for developing statistical characterizations of the channel based on channel observations. In one possible embodiment, the channel probability model generator may be selecting and adopting one out of a fixed collection of probabilistic channel models, based on the most recent observations of channel status. The same data 412 is sent to a device 416 that acts as a switch routing data from the MAC layer to the appropriate destinations. From the device 416, correctly received symbols 418 are sent to the correlating data processing component 408 that determines a posteriori refined probability distribution functions for incorrectly received symbols given all available and correlated reference information. Correctly received symbols 418 are also sent to a video decoder 420 for regular decoding and display. Incorrectly received symbols which could not be corrected 422, are sent to the MAP formulation and solution component 406 for possible error correction. The MAP formulation and solution component 406 accepts data from the data routing switch device 416 and from both memory modules 1 404 and 2 410 to calculate the Maximum a Posteriori Probability functional. The MAP functional is used to determine a most likely value for an incorrectly received symbol, through a maximization process. Symbols that are corrected (424) by the MAP formulation and solution component 406 are returned to their respective positions in the stream of symbols 418 sent to the video decoder 420.

An a posteriori distribution is a synonym for the conditional probability distribution of a symbol/parameter, given the available knowledge obtained after performing a set of—desirably related—observations. In order to use this knowledge, the a posteriori distribution is marginalized through the use of Bayes' Rule and the observation is conditioned on hypothesis about the symbol/parameter to be estimated. For a decoding method using the Maximum A Posteriori Probability estimation framework, the following a posteriori PDF maximization problem needs to be solved:

$$\hat{\Theta} = \arg \max_{\Theta} \ p(\Theta \mid x). \quad [2]$$

This will maximize the a posteriori probability of an unknown symbol $\Theta$ to be estimated, given the observation x and return the value of $\Theta$ achieving this maximum. In one embodiment, the observation x will be the binary data, i.e., bits, present in the corrupt Turbo information packet, and the randomness in x will be stemming from the randomness in the channel which needs to be characterized by virtue of an appropriate probabilistic model. In the above equation [2], $p(\Theta|x)$ denotes the conditional probability of symbol $\Theta$ given the observation x. Hence it reflects the altered state of knowledge about $\Theta$ after the observation, hence the name 'a posteriori probability'. Symbol $\Theta$ represents a bitstream symbol, such as, for example, a macroblock type, a quantization parameter, an intra prediction direction, a motion vector (differential), a DC coefficient (differential), an AC coefficient, etc. Per Bayes' Theorem, a maximization problem equivalent to the one depicted in equation [2] is as follows:

$$\hat{\Theta} = \arg \max_{\Theta} \ p(x \mid \Theta)p(\Theta). \quad [3]$$

In one example, equation [3] is used to determine the actual value of an incorrectly received symbol. The term $p(\Theta)$) is the a priori PDF (or the a priori probability) of the bitstream symbol $\Theta$ to be (soft) decoded. Hypotheses regarding $\Theta$, i.e., permissible values for $\Theta$, as well as the a priori likelihoods (in the form of an a priori continuous or discrete PDF) associated with these hypotheses, will be constructed based on "healthy", i.e., reliable, correlating source observations. In one example, the reliable correlating source observations are provided by correctly received information in neighboring entities, both spatial and temporal, such as, for example, in neighboring blocks, macroblocks, slices and frames. The data known-to-be-healthy, for example, the correctly received bits on either side of the suspect bitstream segment, provide a hard constraint, which cannot be conflicted with any hypothesis. Likewise, no hypothesis can lead to syntax or semantic violations within data segments known to be healthy. Both of these conditions are individually necessary for the feasibility of any hypothesis and therefore the failure of either of them is sufficient to discard a hypothesis.

Bayes' Rule substitutes the a posteriori PDF $p(\Theta|x)$ in equation [2] with the product of $p(x|\Theta)$) and the a priori PDF $p(\Theta)$) of the symbol $\Theta$, to obtain the equivalent equation [3]. The equivalency implied here is in terms of the result of the maximization problem. The function (conditional density) $p(x|\Theta)$) defines the probability of observation x, given symbol $\Theta$, and as such, it is a function of the channel only and therefore $p(x|\Theta)$ can be completely characterized by an appropriate (fixed or variable) channel model. On the other hand, per an important concept of the disclosed methods, the a priori PDF $p(\Theta)$ of the symbol $\Theta$, is substituted with an a posteriori refined PDF for $\Theta$, based on the available reliable correlating information.

Figure 5:
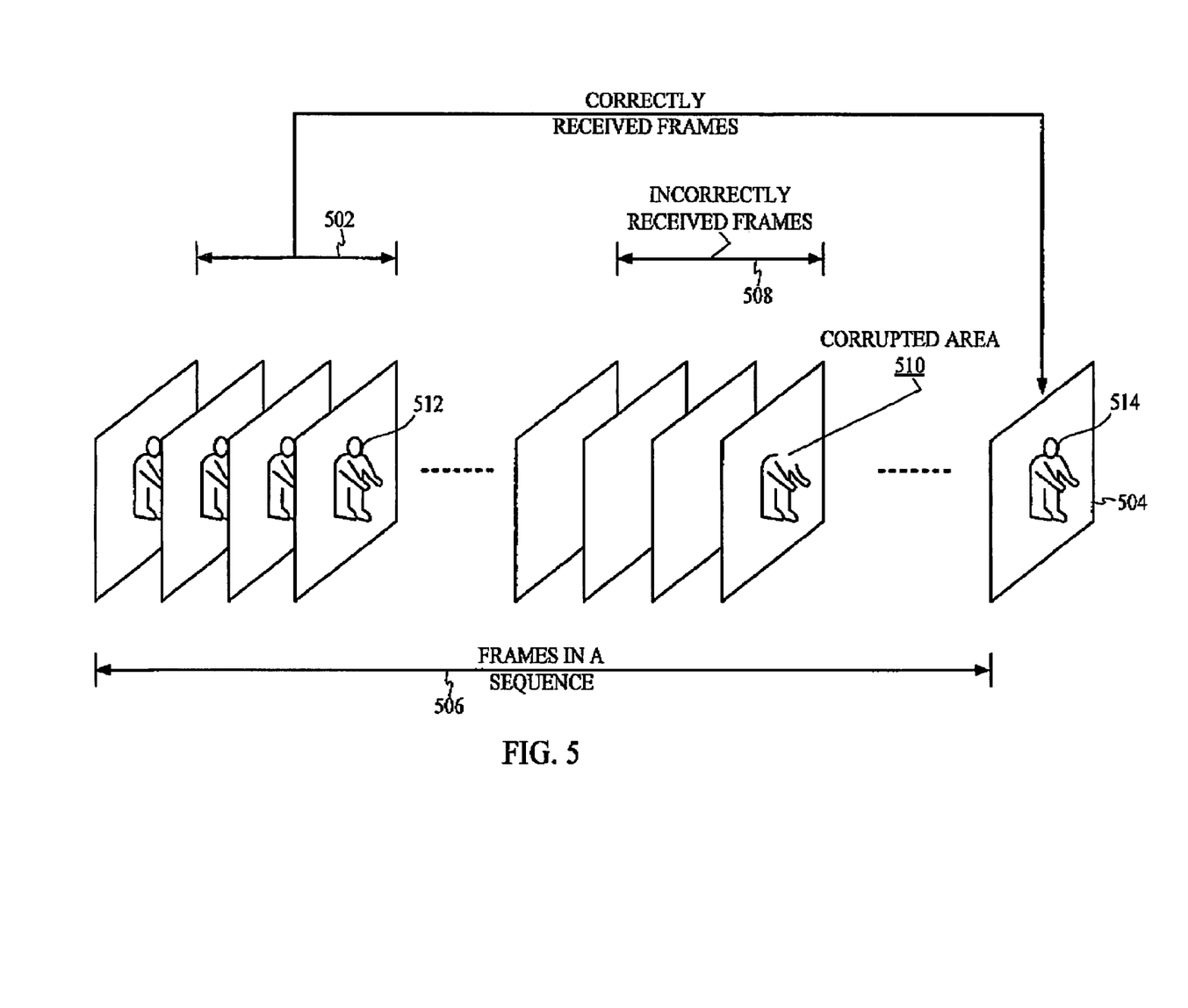
FIG. 5 is one example of an illustration of a sequence of frames.

FIG. 5 is an illustration of temporally oriented frames. Healthy source observations can come from spatially neighboring blocks, shown as adjacent blocks A (302) and B (304) in FIG. 3 or from a temporal relationship as shown in FIG. 5. As discussed above, temporal variation in picture/frame contents may be slow to cause drastic changes to occur between video frames 502 and 504 in a video sequence 506 that contains a set of consecutive and incorrectly received frames 508. Consequently, a probability model for missing symbols, such as one that would provide a likelihood for data pertinent to a corrupted area 510 can be obtained by using correlating non-corrupted reference data 512 and 514. Such correlating data is to be used in providing the a posteriori refinement to the a priori probability distribution function of equation [3].

Referring to equation [3], the term $p(x|\Theta)$, representing the probabilistic model (i.e., a PDF) conditionally describing the observation from the channel given the channel input, will be based on an analysis of PDFs derived from measuring channel conditions, i.e., bit error patterns observed on the underlying channel i.e. a channel error model (channel probability model generator component 402 and memory module 1 404 in FIG. 4). Data for this purpose can be gathered either through a realistic channel simulation or from actual field trials in which the real transmit and receive subsystems are put in use with known input and recorded output signals.

The examples provided below describe the use of various probabilistic models. Any useful probabilistic model can be used to generate a PDF and are not limited to those described below. Table 2 illustrates a probability density function (PDF) of residual burst lengths, i.e., the PDF of the streak lengths for consecutive uncorrected Reed-Solomon (RS) codeword symbol erasures experienced by a mobile receiver. Table 2 uses an (N, K) RS code, a rate j/m Turbo code, and the columns-first scan pattern for data placement in the RS information block.

Typical values for the various parameters mentioned above and also referred to in FIG. 1 can be stated as follows:

N=16;

K∈{15, 14, 12};

L=122; with an additional 3 bytes appended for the CRC checksum, trailing Turbo coding bits (a.k.a. tail bits) and reserve bits, the overall Turbo information packet size becomes 125 bytes=1000 bits; and Turbo coding rate∈{1/3, 1/2, 2/3}.

Under these assumptions, in a worst case, 4 consecutive Turbo information packets get erased. With respect to FIG. 1, since application layer data, e.g., video coding layer data, is scanned into the Reed-Solomon code block, columns-first, data from a worst case of 4 consecutively erased Turbo information packets, will map to 4 consecutive GF(256) symbols, i.e., 4 bytes, in each column of FIG. 1 defining a RS codeword. Under these assumptions, in a worst case example, a decoder decodes through a maximum of 4 bytes (32 bits) of application layer data, corrupt with bit errors in unknown locations. According to these sample statistics, bursts of maximum possible length 4 is almost twice as likely (probability≈0.4) as any other burst length (1, 2, or 3 each with probability≈0.2). It is to be noted that these statistics only serve as an example and that actual statistics observed in a real implementation are strongly dependent on the inner and outer code rates used as well as other factors.

Table 3 shows a PDF for the total number of bits in error in an erased Turbo information packet. This statistic can be used to conclude an average number of bit errors for erased packets or an a priori probability of a bit (in an erased packet) being in error.

TABLE 2

Sample residual burst length distribution.

TABLE 3

Distribution of total number of bit errors in an erased Turbo information packet.

Table 4 shows the PDF of the spread of bits in error in an erased Turbo information packet. This is nothing but the error burst length within that packet. The sample statistics in Table 4 indicates that typically the bits in error are not localized but they rather span the entire packet.

TABLE 4

Distribution of error burst length inside an erased Turbo information packet.

Table 5 illustrates the PDF of the streak lengths of bits in error i.e. PDF of the count of consecutive bits all of which are in error, inside an erased Turbo information packet. As it will become clear, this particular statistic is very closely related to bit error patterns and plays a very important role in an example discussed below.

TABLE 5

Distribution of the number of consecutive bits in error in an erased Turbo information packet.

Finally, Table 6 reflects the PDF of the distance separating neighboring streaks of bit errors inside an erased Turbo information packet. Just like for the statistics reported in Table 5, this particular statistics is also very closely related to a simple and efficient model for bit error patterns.

TABLE 6

Distribution of the distance between bit error streaks in an erased Turbo information packet:

In one example, probability models in Tables 7, 8 and 9 below are used. Without loss of generality, and only for illustrative purposes, it is assumed that the decoder is parsing and entropy decoding only, i.e., back-to-back, coeff_token syntax elements from the bitstream. There are two reasons for this assumption. The first is that this setting provides an adequate example to illustrate the fundamental idea without the need for introducing other syntax elements' codebooks which would complicate the example described. Secondly, there is no immediate access to other syntax elements' PDFs which requires a similar encoding simulation based statistical analysis study to be carried out for them.

TABLE 7

Sample a posteriori refined PDF of coeff_token for the context '0 ≦ nC < 2' (from Table 1).

| TotalCoeff | TrailingOnes | | | |
|---|---|---|---|---|
| | 0 | 1 | 2 | 3 |
| 0 | 0.4973 | 0.0000 | 0.0000 | 0.0000 |
| 1 | 0.0307 | 0.2999 | 0.0000 | 0.0000 |
| 2 | 0.0059 | 0.0179 | 0.0855 | 0.0000 |
| 3 | 0.0018 | 0.0045 | 0.0077 | 0.0226 |
| 4 | 0.0007 | 0.0018 | 0.0025 | 0.0094 |
| 5 | 0.0003 | 0.0005 | 0.0011 | 0.0039 |
| 6 | 0.0001 | 0.0003 | 0.0004 | 0.0020 |
| 7 | 0.0001 | 0.0001 | 0.0002 | 0.0011 |
| 8 | 0.0000 | 0.0001 | 0.0001 | 0.0005 |

TABLE 7-continued

Sample a posteriori refined PDF of coeff_token for the context '0 ≦ nC < 2' (from Table 1).

| TotalCoeff | TrailingOnes | | | |
|---|---|---|---|---|
| | 0 | 1 | 2 | 3 |
| 9 | 0.0000 | 0.0000 | 0.0001 | 0.0003 |
| 10 | 0.0000 | 0.0000 | 0.0000 | 0.0001 |
| 11 | 0.0000 | 0.0000 | 0.0000 | 0.0001 |
| 12 | 0.0000 | 0.0000 | 0.0000 | 0.0000 |
| 13 | 0.0000 | 0.0000 | 0.0000 | 0.0000 |
| 14 | 0.0000 | 0.0000 | 0.0000 | 0.0000 |
| 15 | 0.0000 | 0.0000 | 0.0000 | 0.0000 |
| 16 | 0.0000 | 0.0000 | 0.0000 | 0.0000 |

For the a priori PDF of coeff_token, its basic context dependent a posteriori refined PDF is used for the assumed underlying context. As noted earlier, for example through the identification of a neighboring block (block B 304 in FIG. 3) with stronger expected correlation (vertical edge 308 likely to continue as vertical edge 310 in FIG. 3) to the current block (block 306 in FIG. 3), even the context based a posteriori refined PDF can be transformed so as to reflect this inference.

TABLE 8

Sample PDF of streak lengths for consecutive bit errors, from Table 5.

| Bit Error Streak Length | Probability |
|---|---|
| 1 | 0.7 |
| 2 | 0.2 |
| 3 | 0.07 |
| 4 | 0.02 |
| 5 | 0.01 |
| ≧6 | 0 |

TABLE 9

Sample truncated i.e. partial, PDF of inter-error-streak distances specified as number of bits, from Table 6.

| Inter-Error-Streak Distance | Probability |
|---|---|
| 1 | 0 |
| 2 | 0.3 |
| 3 | 0.22 |
| 4 | 0.15 |
| 5 | 0.11 |
| 6 | 0.075 |
| 7 | 0.05 |

In one example, the decoder is provided with the following 3 bytes as part of the bitstream received by the physical layer. The FEC layer has already processed the data and marked the middle byte as coming from an erased packet. Hence all bits in the middle byte are suspected of being contaminated by bit errors. In the following, '✓' and '?' are respectively used to mark healthy and potentially corrupt bits and 'X' denotes a bit whose value is not relevant to this example. Bits will also be referred to by their position indices and the bit position numbering is from left to right starting with 1 and going up to 24; note that bits 25 and 26 are also shown.

```
byte boundaries:
↓               ↓               ↓               ↓ error status indicator:
 ✓ ✓ ✓ ✓ ✓ ✓ ✓   ? ? ? ? ? ? ? ?   ✓ ✓ ✓ ✓ ✓ ✓ ✓ bits:
 X 0 0 0 1 0 0 0   1 0 1 0 0 0 0 1   0 1 0 0 0 0 0 0   1 1 X
```

In this example, the decoder has successfully decoded coeff_token (TrailingOnes, TotalCoeff)=(1, 2) with codeword '000100' from bit positions 2 to 7 inclusive. As discussed above, the healthy bits present on either side of the potentially corrupt byte establish important constraints for verifying/evaluating the various hypotheses that a decoder may generate. The use of additional constraints such as:

continuity/smoothness of resulting pixel domain features such as continuity across block borders with available neighbors; and no parsing and entropy decoding failures i.e. no syntax and semantic check failures, for a certain number of consecutive healthy bits after the suspected error location;

is important and recommended since they will enhance the success of the proposed algorithm. Both of the above constraints serve to increase the level of confidence associated with a feasible hypothesis further. For example, a particular hypothesis regarding the original value of a corrupt symbol may lead to a relatively high a posteriori probability and be consistent with the first few leading healthy bits immediately following the potentially corrupt bitstream segment in which it lies. However, if subsequent decoding based on this hypothesis leads to a later syntax or semantic failure in the bitstream in a region of the bitstream known to be received correctly, then this is a sufficient indicator that the underlying hypothesis was not correct and should be discarded. As such, each and every symbol syntactically and semantically correctly decoded subsequent to the choice of a particular hypothesis, actually increases the level of confidence in that hypothesis. The details of the implementation of these ideas will vary among embodiments.

Starting at bit position 8, the following sequence of coeff_token values can be decoded from the above bitstream: (1, 1) (1, 1) (2, 3) [(0, 3) or (1, 4)]→'01' '01' '0000101' '00000011X.'

From Table 7, the a priori probability (to be precise the a posteriori refined probability measure) associated with this hypothesis based on a memoryless, i.e., independent symbols, model is: $0.2999 \times 0.2999 \times 0.0077 \approx 6.9254 \times 10^{-4}$. (P((0, 3)) or P((1, 4)) is not included in this calculation since both of the corresponding codewords lie entirely within the region of healthy bits.)

The above a priori probability for this hypothesis should be further scaled by the conditional probability of the observation from the channel given the hypothesis. This hypothesis implies that there are no bit errors in the suspected middle byte. Given either an expected value of 2 bits in error out of every 8 (on average ~250 bits in error out of 1000 bits) or the probability of the implied inter-error-streak distance of $\geq 8$ bits in this case, having no errors at all among the middle 8 suspect bits, is not a likely event and hence it corresponds to a rather small probability. Therefore, P(Inter-Error-Streak Distance $\geq 8$)=0.095 can be used as the conditional probability of the observation from the channel given the hypothesis. With this scaling, the probability measure associated with the above hypothesis i.e. P(' . . . 0001000 10100001 0100000011 . . . ' transmitted and received with no bit errors), becomes $6.5791 \times 10^{-5}$.

Since, in this example, there are only 8 bits potentially contaminated with bit errors, the actual error pattern will be one out of the 256 possible 8-bit long binary sequences. In this representation, 0 will represent a 'no-error' bit position and 1 will imply a bit position 'in-error'. Out of these 256 possible error patterns (error masks), some can be immediately disqualified from being potential hypotheses. For example those patterns which contain the subsequence '. . . 101 . . . ', since this will correspond to an inter-error-streak distance of 1 having probability 0 (from Table 9), will be assigned an overall probability of 0. Hence, they can be immediately dropped from the decoder's list of potential error pattern hypotheses. Even though a decoder may not be able to shorten this list as described due to its different error pattern statistics, it can still rule-out, delay or conditionally undertake the assessment of certain error pattern hypotheses corresponding to not-so-likely patterns such as those containing too many or too few bit errors with respect to the expected rate of bit errors.

As an example of the decoder's checking/evaluating one possible error pattern as a feasible hypothesis, consider the error pattern: '10010001'. When this error pattern is applied to i.e. ex-or'ed with, the middle byte above, effectively removing the errors from the received channel output, the following 3 byte sequence (again with the additional 25th and 26th bits) is reached:

X0001000 00110000 01000000 11X.

Starting at bit position 8, the following sequence of coeff_token values can be decoded from the above bitstream:

(3, 3)(3, 6)(3, 4)→'00011' '00000100' '000011'

From Table 7, the a priori probability (more accurately the a posteriori refined probability measure) associated with this hypothesis again based on our previous memoryless i.e. independent symbols, model is:

$0.0226 \times 0.0020 \approx 4.52 \times 10^{-5}$, where P((3, 4)) is not included in this calculation since its corresponding codeword lies entirely within the region of healthy bits.

As before, the above a priori probability for this hypothesis should be further scaled by the conditional probability of the observation from the channel given the hypothesis. The decoder can avoid this calculation noting that, the above probability is already smaller than the probability measure associated with the 'no bit errors' hypothesis ($6.5791 \times 10^{-5}$). Nevertheless, to be complete and to provide another example of this process this calculation is continued. The assumed error pattern was '10010001'. This can be decomposed into the following sequence of events in the channel:
'Single bit error'; 'Inter-error-streak distance of 2'; 'Single bit error'; 'Inter-error-streak distance of 3'; 'Single bit error'

Again assuming a simple memoryless model for error patterns, the probability associated with the above error pattern can be written as:

$0.7 \times 0.3 \times 0.7 \times 0.22 \times 0.7 \sim = 0.0226$.

With this scaling, the probability measure associated with the current hypothesis i.e. P(' . . . 0001000 00110000 01000000 11 . . . ' transmitted and received with error pattern '10010001' corrupting the middle byte), becomes $1.0232 \times 10^{-6}$. Based only on a comparison of these two a posteriori likelihoods, a decoder would prefer the first hypothesis of:

"' . . . 0001000 10100001 01000000 11 . . . ' transmitted and received with no bit errors".

Of course, the decoder needs to evaluate in some manner all possible hypotheses in the above described general framework and, as importantly, incorporate additional constraints into this evaluation to improve the error correction rate. Although the above example considered hypotheses and corresponding probabilities based on the decoding of a single symbol—as an example coeff_token was used, similar methods can be applied to a vector of symbols comprising more than one symbol. These symbols may be of the same type, i.e., a homogeneous vector, or of different types, i.e., a heterogeneous vector. Considering a vector of symbols, i.e., multiple symbols simultaneously, instead of one symbol at a time, can offer more constraints, additional statistical information and opportunities for a more efficient and better structured formulation that could improve the error correction rate and lower computational complexity.

In regular bitstream syntax, symbols with varying amount of significance to the reconstructed signal are interleaved together. Slice data partitioning, SDP, enables grouping together of coded representations of syntax elements with similar/comparable significance. This reformatting has the following obvious advantage. If a partition, i.e., data chunk, of lesser significance gets corrupt with an error, it can be simply and safely ignored i.e. dropped, and this corruption will not contaminate other partitions' data which can be used to achieve a lower quality but still useful reconstruction. As such SDP can be used to advantage to increase the effectiveness as well as to reduce the computational complexity associated with different embodiments.

In one example, the disclosed methods may conditionally be turned on and get executed only when an SDP partition of high significance gets corrupt. Otherwise i.e. for a partition of lower significance, the data in the corrupt partition may be only partially used i.e. only the known-to-be-good portion is used, or dropped altogether to avoid the additional complexity required for processing it.

In another example of the disclosed methods being used in conjunction with SDP, the computational efficiency of the error correction scheme is improved. This is useful in an embedded environment characterized by computational, memory or power limitations. The disclosed methods can require access to a significant amount of data such as the probability models for many different types of symbols. The cache efficiency of an embedded device is an important factor in determining the execution speed and load on the processor. Not requiring very large sets of data in short execution periods can result in avoiding cache data trashing or frequent cache rewrites, and hence can result in increased cache hit rates. SDP reduces the type variety of syntax elements in each data partition. In return, this increases the coherence of data required to process this limited subset of syntax elements. This reduction in number of syntax elements can also result in a corresponding reduction in the amount of reference data needed for assigning probabilities to error pattern hypotheses.

Figure 6:
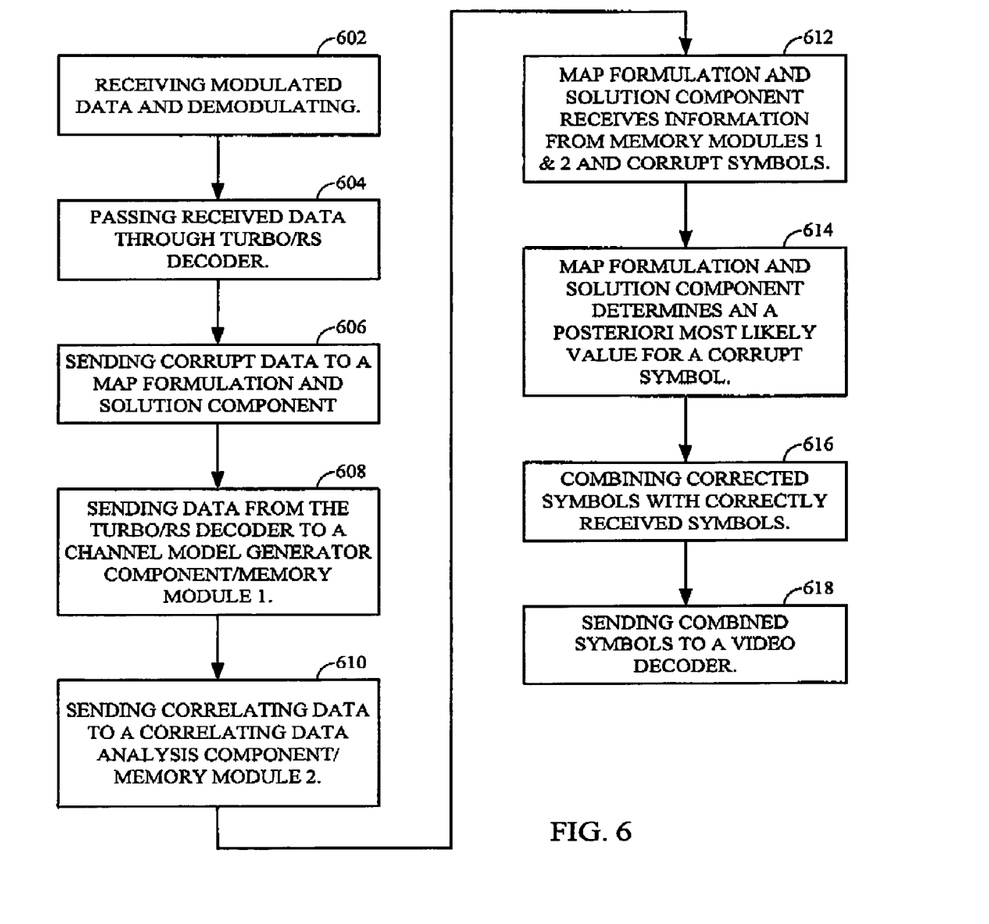
FIG. 6 is one example of a flow diagram for a method of joint source-channel MAP entropy decoding.

FIG. 6 is one example of a flow diagram for a method of MAP based joint source-channel entropy decoding. Coded and modulated symbols in a bitstream are received at a demodulator of a wireless remote device and demodulated, step 602. Receiving means, such as demodulator 210 in FIG. 2, can perform step 602. The symbols can provide information regarding any type of compressed data, including but not limited to compressed multimedia data such as a macroblock type, a quantization parameter, an intra prediction direction, a motion vector, a DC coefficient or AC coefficient. After demodulation, the symbols are passed through an error correcting decoder, such as a concatenated Turbo/Reed-Solomon decoder, step 604. Decoding means and corrupt bit determining means, such as Turbo/Reed-Solomon decoder 200 in FIG. 2, can perform step 604. After error detection and correction at the Turbo/Reed-Solomon decoder, a device acting as a switch (see component 416 of FIG. 4) sends symbols that remain corrupt or partially corrupt to a MAP formulation and solution component (see component 406 of FIG. 4) in the application layer, step 606. Output from the Turbo/Reed-Solomon decoder is also sent to a channel probability model generator (see component 402 of FIG. 4) for determining, i.e., calculating or selecting, appropriate probabilistic characterizations of the current channel status, step 608. The data routing switch sends correlating data to a correlating data analysis component (see component 408 of FIG. 4). The correlating data can be obtained, for example, from symbols positioned either spatially or temporally, close to the corrupt symbol, step 610. The MAP formulation and solution component accepts data from the memory modules 1 and 2 (see modules 404 and 410 of FIG. 4) and also symbols which could not be corrected from the data routing switch, step 612, and solves a maximization problem to maximize the a posteriori PDF for the corrupt symbol, step 614. The MAP formulation and solution component is consequently able to calculate a most likely value, for the (incorrectly received and could not be corrected), i.e., corrupt or partially corrupt symbol, step 614. Hypothesis determining means and probability assigning means, such as MAP formulation and solution component 406 of FIG. 4, can perform step 614. The corrected symbols from the MAP formulation and solution component are joined with correctly received (including incorrectly received but subsequently corrected by FEC) symbols, step 616, and the data is sent to a video decoder, the output of which is transferred to a display unit, step 618.

It is important to note that the disclosed methods can be applied to the processing of not only H.264 bitstreams, but also to other currently available or future data compression schemes designed for video, image, audio and other forms of media. As an example, the present invention can be applied to Context-Based Adaptive Arithmetic Coding (CABAC). A MAP optimization approach as discussed can be adapted to CABAC's arithmetic coding scheme since CABAC uses a similar probability modeling for generating contexts for symbols that are "binarized" or converted into a binary code. In CABAC, a non-binary-valued symbol (e.g. a transform coefficient or motion vector) is binarized prior to arithmetic coding. This process is similar to the process of converting a symbol into a variable length code but the binary code is further encoded (by the arithmetic coder) prior to transmission. A "context model" is a probability model for one or more bits of the binarized symbol. This model may be chosen from a selection of available models depending on the statistics of recently-coded symbols. The context model stores the probability of each bit being "1" or "0". The selected context model is then updated based on the actual coded value. Application of a posteriori information i.e., correlating data from neighboring (spatial/temporal) symbols, to refine raw a priori symbol distributions, along with conditional PDFs describing channel conditions as described above can be applied to formulate a MAP optimization approach for entropy decoding of CABAC symbols in error.

Aspects of the disclosed examples include, but are not limited to, the descriptions below.

A method for error correction that includes receiving a bitstream, the bitstream comprising one or more bits, determining if the bitstream has one or more corrupt bits, determining one or more hypotheses representing an error pattern, and assigning a probability to each of the hypotheses, wherein the probability is determined based on one or more reference data.

An apparatus for error correction that includes means for receiving a bitstream, the bitstream comprising one or more bits, means for determining if the bitstream has one or more corrupt bits, means for determining one or more hypotheses representing an error pattern, and means for assigning a probability to each of the hypotheses, wherein the probability is determined based on one or more reference data.

An electronic device for error correction that is configured to receive a bitstream, the bitstream comprising one or more bits, to determine if the bitstream has one or more corrupt bits, to determine one or more hypotheses representing an error pattern, and to assign a probability to each of the hypotheses, wherein the probability is determined based on one or more reference data.

A computer readable medium embodying means for causing a computer to execute a method that includes receiving a bitstream, the bitstream comprising one or more bits, determining if the bitstream has one or more corrupt bits, determining one or more hypotheses representing an error pattern, and assigning a probability to each of the hypotheses, wherein the probability is determined based on one or more reference data.

Those of ordinary skill would further appreciate that the various illustrative logical blocks, modules, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed methods.

The various illustrative logical blocks, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC). The ASIC may reside in a wireless modem. In the alternative, the processor and the storage medium may reside as discrete components in the wireless modem.

Thus, a method, and apparatus to provide improved error correction capabilities by performing an optimization problem formulation within, the Maximum a Posteriori Probability (MAP) framework and solving it to determine likelihoods for hypotheses about entropy coded symbols, the representations of which are corrupt with erroneous bits, have been described.

What is claimed is:

1. A method for error correction in a mobile device, comprising:
   receiving coded data in a physical layer;
   obtaining error characteristics for the coded data;
   obtaining a bitstream in an application layer, the bitstream comprising one or more bits from the coded data;
   determining if the bitstream has one or more corrupt bits;
   determining one or more hypotheses representing an error pattern for the bitstream; and
   assigning a probability to each of the hypotheses in order to correct the corrupt bits,
   wherein the step of determining one or more hypotheses comprises determining the hypotheses for a group of bits making up a coded symbol, wherein the coded symbol is chosen from the group consisting of a macroblock type, a quantization parameter, an intra prediction direction, a motion vector, a DC coefficient and an AC coefficient,
   and wherein the steps of receiving, obtaining, determining and assigning are performed in the mobile device.

2. The method of claim 1, further comprising:
   decoding uncorrupt bits;
   determining that one of the hypotheses leads to a syntax or semantic failure within the uncorrupt bits; and
   assigning a probability of zero to the hypothesis leading to the failure.

3. The method of claim 1, wherein determining the hypotheses further comprises:
   determining the hypotheses for a group of bits making up a coded symbol.

4. The method of claim 1, further comprising:
   receiving the coded data over a wireless network.

5. The method of claim 1, wherein the coded data is received by a demodulator.

6. The method of claim 1, wherein the error characteristics comprise coded symbols and bits.

7. The method of claim 1, wherein the one or more hypotheses representing an error pattern for the bitstream are used to determine a later syntax or semantic failure in the bitstream.

8. The method of claim 1, wherein the probability assigned to each of the hypotheses is a refined probability distribution.

9. The method of claim 1, wherein the error pattern comprises variable length coding.

10. A method for error correction in a mobile device, comprising:
   receiving coded data in a physical layer;
   obtaining error characteristics for the coded data;
   obtaining a bitstream in an application layer, the bitstream comprising one or more bits from the coded data;
   determining if the bitstream has one or more corrupt bits;
   determining one or more hypotheses representing an error Pattern for the bitstream;
   assigning a probability to each of the hypotheses in order to correct the corrupt bits; and
   determining a probability distribution for an incorrectly received symbol using information chosen from the group consisting of a bit-error-streak distance, an error burst length, an average number of bit errors for erased packets, neighboring bytes with no bit errors, user data fields and error characteristics of received packets,
   wherein the steps of receiving, obtaining, determining and assigning are performed in the mobile device.

11. An apparatus for error correction, comprising:
   means for receiving coded data in a physical layer;
   means for obtaining error characteristics for the coded data;
   means for obtaining a bitstream in an application layer, the bitstream comprising one or more bits from the coded data;
   means for determining if the bitstream has one or more corrupt bits;
   means for determining one or more hypotheses representing an error pattern for the bitstream; and
   means for assigning a probability to each of the hypotheses in order to correct the corrupt bits,
   wherein the means for determining one or more hypotheses comprises means for determining the hypotheses for a group of bits making up a coded symbol, wherein the coded symbol is chosen from the group consisting of a macroblock type, a quantization parameter, an intra prediction direction, a motion vector, a DC coefficient and an AC coefficient.

12. The apparatus of claim 11, further comprising:
   means for decoding uncorrupt bits;
   means for determining that one of the hypotheses leads to a syntax or semantic failure within the uncorrupt bits; and
   means for assigning a probability of zero to the hypothesis leading to the failure.

13. The apparatus of claim 11, wherein determining the hypotheses further comprises:
   means for determining the hypotheses for a group of bits making up a coded symbol.

14. The apparatus of claim 11, further comprising:
   means for receiving the coded data over a wireless network.

15. The apparatus of claim 11, wherein the coded data is received by a demodulator.

16. The apparatus of claim 11, wherein the error characteristics are received comprising coded symbols and bits.

17. The apparatus of claim 11, wherein the one or more hypotheses representing an error pattern for the bit stream are used to determine later syntax or semantic failure in the bistream.

18. The apparatus of claim 11, wherein the probability assigned to each of the hypotheses is a refined probability distribution.

19. The apparatus of claim 11, wherein the error pattern comprises variable length coding or Huffmann coding.

20. An apparatus for error correction, comprising:
   means for receiving coded data in a physical layer;
   means for obtaining error characteristics for the coded data;
   means for obtaining a bitstream in an application layer, the bitstream comprising one or more bits from the coded data;
   means for determining if the bitstream has one or more corrupt bits;
   means for determining one or more hypotheses representing an error pattern for the bitstream;
   means for assigning a probability to each of the hypotheses in order to correct the corrupt bits; and
   means for determining a probability distribution for an incorrectly received symbol using information chosen from the group consisting of a bit-error-streak distance, an error burst length, an average number of bit errors for erased packets, neighboring bytes with no bit errors, user data fields and error characteristics of received packets.

21. An electronic device for error correction, the electronic device configured to receive coded data in a physical layer, obtain error characteristics for the coded data, obtain a bitstream, the bitstream comprising one or more bits, for the coded data in an application layer to determine if the bitstream has one or more corrupt bits, to determine one or more hypotheses representing an error pattern for the bit stream, and to assign a probability to each of the hypotheses in order to correct the corrupt bits,
   wherein the electronic device is further configured to determine the hypotheses for a group of bits making up a coded symbol, wherein the coded symbol is chosen from the group consisting of a macroblock type, a quantization parameter, an intra prediction direction, a motion vector, a DC coefficient and an AC coefficient.

22. The electronic device of claim 21, further configured to decode uncorrupt bits, to determine that one of the hypotheses leads to a syntax or semantic failure within the uncorrupt bits, and to assign a probability of zero to the hypothesis leading to the failure.

23. The electronic device of claim 21, further configured to determine the hypotheses for a group of bits making up a coded symbol.

24. The electronic device of claim 21, further configured to receive the bitstream over a wireless network.

25. The electronic device of claim 21, wherein the coded data is received by a demodulator.

26. The electronic device of claim 21, wherein the error characteristics comprise coded symbols and bits.

27. The electronic device of claim 21, wherein the one or more hypotheses representing an error pattern for the bit stream are used to determine later syntax or semantic failure in the bitstream.

28. The electronic device of claim 21, wherein the probability assigned to each of the hypotheses is a refined probability distribution.

29. The electronic device of claim 21, wherein the error pattern comprises variable length coding.

30. An electronic device for error correction, the electronic device configured to receive coded data in a physical layer, obtain error characteristics for the coded data, obtain a bitstream, the bitstream comprising one or more bits, for the coded data in an application layer to determine if the bitstream has one or more corrupt bits, to determine one or more hypotheses representing an error pattern for the bit stream, and to assign a probability to each of the hypotheses in order to correct the corrupt bits, Wherein the electronic device is further configured to determine a probability distribution for an incorrectly received symbol using information chosen from the group consisting of a bit-error-streak distance, an error burst length, an average number of bit errors for erased packets, neighboring bytes with no errors, user data fields and error characteristics of received packets.

31. A computer readable medium embodying means for causing a computer to execute a method comprising:

receiving coded data in a physical layer;

obtaining error characteristics for the coded data;

obtaining a bitstream in an application layer, the bitstream comprising one or more bits from the coded data;

determining if the bitstream has one or more corrupt bits;

determining one or more hypotheses representing an error pattern for the bitstream, including determining the hypotheses for a group of bits making up a coded symbol, wherein the coded symbol is chosen from the group consisting of a macroblock type, a quantization parameter, an intra prediction direction, a motion vector, a DC coefficient and an AC coefficient; and assigning a probability to each of the hypotheses in order to correct the corrupt bits.

* * * * *